United States Patent [19]

Hollaway

[11] Patent Number: 5,012,124
[45] Date of Patent: Apr. 30, 1991

[54] TOUCH SENSITIVE CONTROL PANEL

[76] Inventor: Jerrell P. Hollaway, 1330 Meadowbrook Rd., NE., Palm Bay, Fla. 32905

[21] Appl. No.: 383,427

[22] Filed: Jul. 24, 1989

[51] Int. Cl.$^5$ .......................................... H01H 35/00
[52] U.S. Cl. ...................................... 307/116; 307/119; 341/22; 341/33; 324/686
[58] Field of Search ................ 324/662, 686; 340/712; 341/33, 22; 200/600; 307/116, 119, 132 R, 132 E, 139

[56] References Cited

U.S. PATENT DOCUMENTS

| 4,152,629 | 5/1979 | Raupp | 307/116 |
| 4,228,534 | 10/1980 | Fellrath et al. | 307/116 |
| 4,237,421 | 12/1980 | Waldron | 341/33 |
| 4,257,117 | 3/1981 | Besson | 307/116 |
| 4,758,735 | 7/1988 | Ingraham | 307/116 |
| 4,924,222 | 5/1990 | Antikidis et al. | 341/33 |

Primary Examiner—J. R. Scott
Assistant Examiner—Jeffrey A. Gaffin

[57] ABSTRACT

A control panel having a series of touch sensitive sensors mounted under a protective cover. The outputs of the sensors are effected by the presence of a human finger on the surface of the cover due to the capacitance of the human body with the earth. A microcomputer is used to distinguish intentional touching of the sensors from incidential contact with the panel, thereby making the control panel useful for controlling multiple functions from a single location.

18 Claims, 1 Drawing Sheet

TOUCH SENSITIVE CONTROL PANEL

BACKGROUND OF THE INVENTION

This invention relates to touch sensitive controls for electrical apparatus and especially multiple input, touch sensitive controls to be used in wet or dirty environments.

There are numerous situations where electrical equipment such as motors, lights and heaters are to be controlled (turned on and off) through some type of control panel from a central location. A good example is found in spa pools and hot tubs. Usually, due to water and chemicals, the environment around a control panel is quite hostile to standard electrical control panels using devices such as toggle switches, membrane switches and potentiometers. Clearly the need exists for a control panel whose electrical components need not be exposed to the local environment, whether chlorinated water from a spa pool or chemicals and dirt from an industrial site.

U.S. Pat. No. 4,651,023 offers a partial solution to the stated problem in that light sensitive resistors (photoresistors) are enclosed in a water tight container and activated by blocking ambient light passing through clear windows in the container. A pair of photoresistors are required for each function in order to form an effective switch; one photoresistor is covered to establish the "on" condition and the other photoresistor is covered for "off". This arrangement is not particularly well suited for systems where many functions are to be controlled from a single panel, due to the large number of photoresistors that would be required, as well as the large number of support components such as operational amplifiers, resistors and capacitors that would be needed.

An objective of the present invention is to provide a control panel that can be operated by selectively touching, or approaching, touch sensitive senors mounted under a clear protective cover. Another objective is to use only one sensor for each function to be controlled, so that each subsequent touch will toggle the function "on" or "off", depending on the last state.

A final objective is to use only a small number of supporting components in the control panel to minimize size and cost and to maximize reliability.

SUMMARY OF THE INVENTION

Disclosed herein is a control panel containing several touch sensitive sensors connected to a high frequency oscillator. Each sensor includes a metallic plate which, when touched, shunts a portion of the oscillator's signal to earth via the body's capacitance. The microcomputer reacts to recognize any sensor whose output voltages changes more than a prescribed amount, compared to the output voltages from other sensors on the panel. Thus, a touched sensor is considered to represent a valid input only if its output voltage meets a selection criteria dictated by the remaining, untouched sensors on the panel.

DESCRIPTION OF PREFERRED EMBODIMENTS

Figure 1:
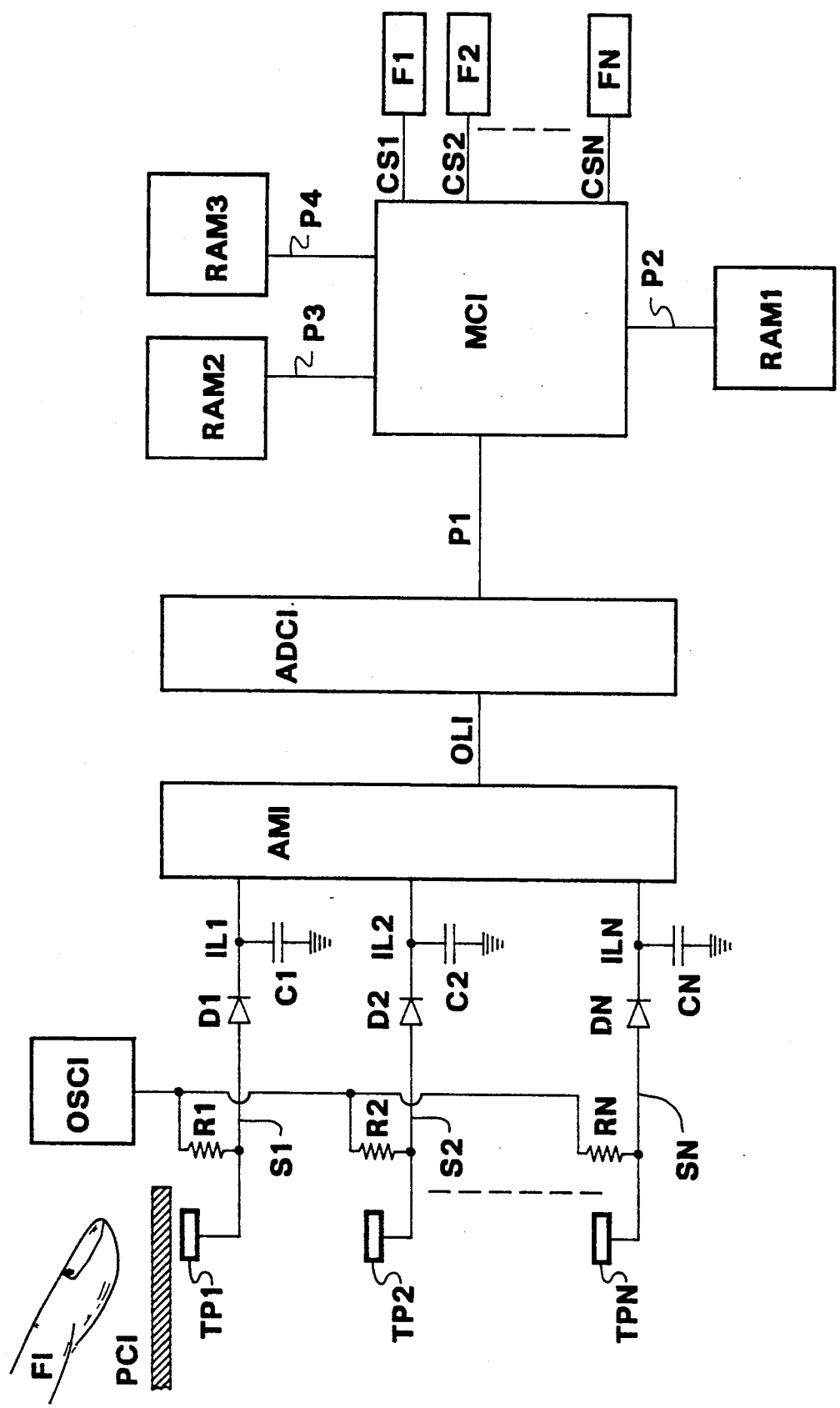
FIG. 1 shows a number of touch sensitive sensors, connected to an oscillator, an analog multiplexer, an analog to digital converter and a digital microcomputer.

Referring to FIG. 1, sensor S1 consists of resistor R1 connected between oscillator OSC1 and the junction of touch plate TP1 with the anode of diode D1. Capacitor C1 is connected between the cathode of D1 and ground. The output of sensor S1 is connected by line IL1 to analog multiplexer AM1. Sensors S2 through Sn are connected to AM1 in a similar manner. The analog voltages represented on lines IL1 through ILn are then presented, in sequence, by AM1 over line OL1 to analog to digital converter ADC1, where each voltage is assigned a digital value. These digital values are presented to microcomputer MC1, via lines Port P1 for comparison of digital values and activation of control signals CS1 through CSn which, in turn, switch power to selected electrical equipment via relays, TRIAC's or other electronic means.

In operation, OSC1 provides a square wave or sine wave oscillating signal of approximately 100 KHz to the input of each sensor via resistors R1-Rn. This AC voltage is then simultaneously present on touch plates TP1-TPn and the anodes of each diode D1-Dn. Diodes D1-Dn rectify this signal to produce DC voltages on capacitors C1-Cn. With nothing in close proximity to touch plates TP1-TPn, the DC voltages on C1-Cn will be more or less the same, differing only due to tolerances in the values of the components used. If, however, touch plate TP1 is approached by finger F1, the signal on TP1 will be suddenly lowered, due to the resulting voltage divider that is formed between the fixed resistor R1 and the natural capacitance of the human body with the earth. If the signal is now lower on TP1, it will also be lower on the anode of D1, and the resulting DC voltage at the cathode of D1 and on the ungrounded side of C1 will also be noticeable lower.

The finger does not necessarily have to come in contact with the touch plate in order to lower the DC voltage across the capacitor. If the oscillator signal is as high as 100 KHz, this signal shunting effect can be detected even when electrically insulating material of 1/16 inch or more is between the finger and the touch plate, as illustrated by panel cover PC1.

The DC voltages on input lines IL1-ILn will no longer be equal with finger F1 touching TP1 of sensor S1. Line IL1 will present a lower DC voltage to analog multiplexer AM1 than any of the untouched lines IL2-ILn.

The DC voltages on line IL1-ILn are time multiplexed by AM1. A sample of each voltage is present, in sequence, on output line OL1. Analog to digital converter ADC1 processes each analog voltage, thus received from AM1, and assigns a digital value to each. The digital values representing the DC voltages are read by microcomputer MC1 through Port P1 and then stored by MC1 in read/write memory RAM1 via Port P2. Although not shown for simplicity's sake, analog multiplexer AM1 and analog to digital converter ADC1 are under the control of microcomputer MC1 at all times. In fact, the function of ADC1, RAM1, RAM2, and RAM3 and a microprocessor with read only memory may be physically included in MC1 in some integrated circuit arrangements. It is also possible that, with a limited number of sensors, analog multiplexer AM1 may not be required at all, if analog to digital converter ADC1 has a sufficient number of inputs.

Returning now to the example of a finger being in contact (or near contact) with touch plate TP1 of sensor S1, the digital value representing S1 in the corresponding location within memory RAM1 will be less than the digital values in the locations of RAM1 that represent sensors S2-Sn. Microcomputer MC1 can now determine if the digital value for S1 is enough lower than the values for the other sensors that it should be considered a valid input to the control panel.

There are various methods of selecting a valid input. The simplest method is to instruct microcomputer MC1 to consider any input as valid if its digital value in RAM1 is less than some fixed number. A more dependable method is to compare each sensor's digital value against the digital values of the other sensors. This comparison can be done against each sensor's value individually, or it can be done against the average value of several sensors. Either way, MC1 must be given a selection criteria to follow. A fixed number can simply be added to the lowest digital value of all sensors and compared to the next lowest value. If the sum of lowest value and the fixed number is still lower than the next lowest value, then MC1 can select the lowest value as being representative of a valid input. The same comparison can be made to the average digital value of all sensors instead of to the next lowest value. Also, rather than using a fixed number for the selection criteria, a fixed percentage of the next lowest value or the average value can be used. This approach is better if large changes in outputs from the sensors are expected due to power supply variations or other conditions.

An even better way to eliminate outside influences from the selection criteria is to compare each sensor's output with its own history. Referring again to FIG. 1, microcomputer MC1 can periodically store the digital value of each sensor's output in designated locations of read/write memory RAM2. Now a two step selection process is possible. First, the real time digital value of each sensor in RAM1 is compared to the digital value in RAM2 that represents that sensor's output from an earlier point in time (perhaps one second ago). If this comparison reveals that a particular sensor's output has decreased by more than a certain amount during this period of time, it probably means that the touch plate of that sensor is now being touched. The amount of change used as a selection criteria can, again, be either a fixed number representing a fixed amount of change, or it can be a fixed percentage of the historical value in RAM2.

It is important on this type of control panel to be sure that the decrease in a particular sensor's output is the result of a deliberate act from a human operator and not just the result of other influences. The best way to make this determination is to require that one and only one sensor has a significantly decreased output before an input can be considered valid. Step two of this selection process is, therefore, to subject any sensor preselected in step 1 to a second comparison. This is done by directing MC1 to store digital data in corresponding locations of read/write memory RAM3 that represent the differences that were found when the values in RAM1 were compared to the value in RAM2. Only differences that result from decreases in values from RAM2 to RAM1 and that meet or exceed the previous selection criteria need be stored in RAM3. Step two of this method is now completed by directing MC1 to compare each value in RAM3 with each other value. If a value is found in RAM3, representing a change between corresponding values in RAM1 and RAM2, that is larger than all other values in RAM3 by a certain amount then, finally, the sensor that corresponds to that change can be considered valid. It is now safe to conclude that one and only one sensor has been touched.

Once micrcomputer MC1 has selected a valid sensor, the only remaining task for MC1 is to activate one or more of switching functions F1-Fn by applying the appropriate voltages to control signal lines CS1-CSn. Normally, succcessive touches of the same sensor will result in alternate states on the corresponding control signal lines. CS1-CSn may be connected to solid state relay drivers, to the gates of thyristors, or used in a variety of ways to control lights, motors, heaters, etc.

Various methods of constructing this control panel may be used. Touch plates TP1-TPn, for example, may be made from almost any electrically conductive metal, such as copper, brass or aluminum, and can be shaped as thin disks or squares. Panel cover PC1, if used, must be made of a material that is not electrically conductive. Glass or plastic materials are obvious choices for PC1. The thickness of PC1 should be kept to the minimum required for the desired structual qualities, since the capacitance between a finger and a touch plate decreases rapidly as thickness increases. If PC1 is eliminated entirely, and direct contact is made with TP1-TPn, it is possible that ambient, 60 Hertz hum may be introduced into the sensor which, when rectified, may counter the effect of shunting the high frequency oscillation to earth. A small value capacitor, for example 0.001 microfarad, inserted between touch plates TP1-TPn and the junctions of resistors R1-Rn with diode D1-Dn will improve the measured response of a direct touch. This is due to the high impedance offered by a small capacitor to a 60 Hz signal compared to a relative low impedance offered to a 100 Khz signal.

It is, of course, understood that oscillator OSC1 can be constructed in a number of ways and some source of DC power is required by all of the circuit elements shown. Also, resistors R1-Rn can be some other form of impedance, such as small capacitors. Many other improvements and implementations may be possible and easily practiced by one skilled in the art of electronics without departing from the spirit and essence of what is taught herewithin.

I claim:

1. A touch sensitive control apparatus comprising, in combination:
    an oscillator producing an oscillation output signal;
    a plurality of touch-responsive sensors coupled in circuit with said oscillator and producing respective analog signals associated with touch-dependent modifications of the oscillation output signal produced by said oscillator;
    an analog-to-digital converter which converts analog signals produced by said sensors into respective digital signals representative thereof; and
    a digital computer which processes said respective digital signals and generates an output associated with a selected one of said sensors on the basis of a prescribed relationship among the analog signals produced by plural ones of said sensors.

2. An apparatus according to claim 1, wherein said digital computer generates an output associated with a selected one of said sensors in response to the analog signal produced by said one sensor differing, by a preselected amount, from an analog signal produced by another of said sensors.

3. An apparatus according to claim 1, wherein said digital computer compares analog signals produced by plural ones of said sensors with a prescribed criterion and, for that sensor whose analog signal has the greatest difference from said prescribed criterion, generates an output associated with that sensor, in response to the analog signal produced by that sensor differing, by a preselected amount, from an analog signal produced by another sensor.

4. An apparatus according to claim 1, wherein said digital computer compares analog signals produced by plural ones of said sensors with a prescribed criterion and, for that sensor whose analog signal has the greatest difference from said prescribed criterion, generates an output associated with that sensor, in response to the analog signal produced by that sensor differing, by a preselected amount, from an analog signal produced by another sensor whose analog signal has the next greatest difference from said prescribed criterion.

5. An apparatus according to claim 1, wherein said digital computer compares analog signals produced by plural ones of said sensors with a prescribed criterion and, for that sensor whose analog signal has the greatest difference from said prescribed criterion, generates an output associated with that sensor, in response to the analog signal produced by that sensor differing, by a preselected amount, from the average of the analog signals produced by plural ones of said sensors.

6. An apparatus according to claim 1, wherein said digital computer compares analog signals produced by plural ones of said sensors with a prescribed criterion and, for that sensor whose analog signal has the greatest difference from said prescribed criterion, generates an output associated with that sensor, in response to the analog signal produced by that sensor differing, by a preselected amount, from a prescribed percentage of the average of the analog signals produced by plural ones of said sensors.

7. An apparatus according to claim 1, wherein said digital computer generates an output associated with a selected one of said sensors in response to the analog signal produced by said one sensor having undergone a change that differs, by a preselected amount, from a change in an analog signal produced by another of said sensors.

8. An apparatus according to claim 1, wherein said digital computer generates an output associated with a selected one of said sensors in accordance with a prescribed relationship among respective changes in the analog signals produced by plural ones of said sensors.

9. An apparatus according to claim 8, wherein said digital computer generates an output associated with a selected one of said sensors in response to the analog signal produced by said one sensor having undergone a change that differs, by a preselected amount, from changes in the analog signals produced by others of said sensors.

10. A touch sensitive control apparatus comprising, in combination:
an oscillator which produces a reference oscillation signal;
a plurality of touch-responsive circuit devices, each of which is coupled in circuit with said oscillator and produces a respective signal representative with a touch-dependent modification of the reference oscillation signal produced by said oscillator; and means, coupled to said plurality of touch-responsive circuit devices, for processing respective signals produced thereby and generating an output associated with a selected one of said touch-responsive circuit devices on the basis of a prescribed relationship among the signals produced by plural ones of said touch-responsive circuit devices.

11. An apparatus according to claim 10, wherein said processing means includes means for generating an output associated with a selected one of said touch-responsive circuit devices in response to the signal produced by said one touch-responsive circuit device differing, by a preselected amount, from a signal produced by another of said touch-responsive circuit devices.

12. An apparatus according to claim 10, wherein said processing means includes means for comparing signals produced by plural ones of said touch-responsive circuit devices with a prescribed criterion and, for that touch-responsive circuit device whose signal has the greatest difference from said prescribed criterion, generating an output associated with that touch-responsive circuit device, in response to the signal produced by that touch-responsive circuit device differing, by a preselected amount, from a signal produced by another touch-responsive circuit devices.

13. An apparatus according to claim 10, wherein said processing means includes means for comparing signals produced by plural ones of said touch-responsive circuit devices with a prescribed criterion and, for that touch-responsive circuit device whose signal has the greatest difference from said prescribed criterion, generating an output associated with that touch-responsive circuit devices, in response to the signal produced by that touch-responsive circuit device differing, by a preselected amount, from a signal produced by another touch-responsive circuit device whose signal has the next greatest difference from said prescribed criterion.

14. An apparatus according to claim 10, wherein said processing means includes means for comparing signals produced by plural ones of said touch-responsive circuit devices with a prescribed criterion and, for that touch-responsive circuit device whose signal has the greatest difference from said prescribed criterion, generating an output associated with that touch-responsive circuit devices, in response to the signal produced by that touch-responsive circuit device differing, by a preselected amount, from the average of the signals produced by plural ones of said touch-responsive circuit devices.

15. An apparatus according to claim 10, wherein said processing means includes means for comparing signals produced by plural ones of said touch-responsive circuit devices with a prescribed criterion and, for that touch-responsive circuit device whose signal has the greatest difference from said prescribed criterion, generating an output associated with that touch-responsive circuit device, in response to the signal produced by that touch-responsive circuit device differing, by a preselected amount, from a prescribed percentage of the average of the signals produced by plural ones of said touch-responsive circuit devices.

16. An apparatus according to claim 10, wherein said processing means includes means for generating output associated with a selected one of said touch-responsive circuit devices in response to the signal produced by said one touch-responsive circuit device having undergone a change that differs, by a preselected amount, from a change in a signal produced by another of said touch-responsive circuit devices.

17. An apparatus according to claim 16, wherein said processing means includes means for generating an output associated with a selected one of said touch-responsive circuit devices in accordance with a prescribed relationship among respective changes in the signals produced by plural ones of said touch-responsive circuit devices.

18. An apparatus according to claim 17, wherein said processing means includes means for generating an output associated with a selected one of said touch-responsive circuit devices in response to the signal produced by said one touch-responsive circuit device having undergone a change that differs, by a preselected amount, from changes in the signals produced by others of said touch-responsive circuit devices.

* * * * *